(12) United States Patent
Jeong

(10) Patent No.: US 8,361,852 B2
(45) Date of Patent: Jan. 29, 2013

(54) METHODS OF MANUFACTURING CMOS TRANSISTORS

(75) Inventor: Yong-Kuk Jeong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/980,519

(22) Filed: Dec. 29, 2010

(65) Prior Publication Data

US 2011/0207273 A1 Aug. 25, 2011

(30) Foreign Application Priority Data

Feb. 19, 2010 (KR) ........................ 10-2010-0014932

(51) Int. Cl.
*H01L 21/336* (2006.01)
*H01L 21/8234* (2006.01)
(52) U.S. Cl. ................................ 438/197; 257/E21.293
(58) Field of Classification Search .................. 438/197; 257/E21.293
See application file for complete search history.

(56) References Cited

U.S. PATENT DOCUMENTS

| 7,371,629 B2 * | 5/2008 | Fu et al. ........................ 438/199 |
| 7,524,707 B2 * | 4/2009 | Adetutu et al. ............... 438/150 |
| 7,763,510 B1 * | 7/2010 | Zhang et al. .................. 438/199 |
| 2008/0142902 A1 | 6/2008 | Chen et al. |
| 2008/0251850 A1 | 10/2008 | Bu et al. |

FOREIGN PATENT DOCUMENTS

KR 10 2007 0039384 A 4/2007

\* cited by examiner

*Primary Examiner* — William D Coleman
(74) *Attorney, Agent, or Firm* — Myers Bigel Sibley & Sajovec

(57) ABSTRACT

A transistor includes a silicon germanium channel layer formed on a portion of a single crystalline silicon substrate. The silicon germanium channel layer includes a Si—H bond and/or a Ge—H bond at an inner portion or an upper surface portion thereof. A PMOS transistor is provided on the silicon germanium channel layer. A silicon nitride layer is provided on surface portions of the single crystalline silicon substrate, the silicon germanium channel layer and the PMOS transistor for applying a tensile stress. The MOS transistor shows good operating characteristics.

20 Claims, 11 Drawing Sheets

METHODS OF MANUFACTURING CMOS TRANSISTORS

CLAIM OF PRIORITY

This application claims priority under 35 USC §119 to Korean Patent Application No. 10-2010-0014932, filed on Feb. 19, 2010 in the Korean Intellectual Property Office (KIPO), the content of which is herein incorporated by reference in its entirety.

BACKGROUND

Example embodiments relate to transistors and methods of manufacturing the same. More particularly, example embodiments relate to highly integrated complementary metal-oxide-semiconductor (CMOS) transistors showing a high performance and methods of manufacturing the same.

Various researches on forming highly integrated transistors having a high performance have been conducted.

For example, a stress controlling process for applying stress onto a channel region of a transistor has been studied. In addition, researches on various materials forming a gate insulating layer and a gate electrode of a transistor also have been widely conducted. Materials having a high dielectricity have been used for forming the gate insulating layer instead of a silicon oxide layer and metal compounds have replaced polysilicon for forming the gate electrode. Further, alternative materials of a substrate for forming the transistor also have been studied.

However, since an n-type metal-oxide-semiconductor (NMOS) transistor and a p-type metal-oxide-semiconductor (PMOS) formed on one substrate may have different electric characteristics, formations of the NMOS transistor and the PMOS transistor through the same manufacturing process may not be an easy task. In addition, physical properties of each material for forming each element of the NMOS and the PMOS transistors may be different and the physical properties of the materials constituting the elements may have a trade-off relationship. Therefore, an optimized NMOS transistor and PMOS transistors may be formed through a complicated manufacturing process.

SUMMARY

Example embodiments provide MOS transistors showing a high performance and having good characteristics.

Example embodiments provide methods of manufacturing MOS transistors as described herein.

According to example embodiments, there is provided a transistor. In some embodiments, the transistor may include a silicon germanium channel layer formed on a portion of a single crystalline silicon substrate and including a Si—H bond and/or a Ge—H bond at an inner portion or an upper surface portion thereof, a PMOS transistor provided on the silicon germanium channel layer and a silicon nitride layer provided on surface portions of the single crystalline silicon substrate, the silicon germanium channel layer and the PMOS transistor, the silicon nitride layer operable to apply a tensile stress.

Some embodiments may include an NMOS transistor on the single crystalline silicon substrate. The NMOS transistor may include a first gate structure including a first gate oxide layer pattern, a first conductive layer pattern and a first polysilicon layer pattern and a first impurity doped region of n-type impurities formed in the single crystalline silicon substrate and at both sides of the first gate structures. In some embodiments, the PMOS transistor includes a second gate structure provided on the silicon germanium channel layer and a second gate oxide layer pattern, a second conductive layer pattern and a second polysilicon layer pattern and a second impurity doped region of p-type impurities formed in the silicon germanium channel layer and at both sides of the second gate structure.

Some embodiments as disclosed herein include methods of manufacturing a transistor. Such methods may include forming a silicon germanium channel layer on a portion of a single crystalline silicon substrate, forming a first gate structure and a second gate structure. Each of the first and second gate structures may include a gate oxide layer pattern, a conductive layer pattern and a polysilicon layer pattern on the single crystalline silicon substrate and the silicon germanium channel layer. Methods may include forming a first impurity region by doping n-type impurities into the single crystalline silicon substrate at both sides of the first gate structure, forming a second impurity region by doping p-type impurities into the silicon germanium channel layer at both sides of the second gate structure, and forming a silicon nitride layer on a surface of the single crystalline silicon substrate, the silicon germanium channel layer and the first and second gate structures. In some embodiments, the silicon nitride layer is operable to remove dangling bonds at an inner portion and/or a surface portion of the silicon germanium channel layer via a depositing gas that includes a reacting gas, an atmosphere gas and a hydrogen gas, and to apply a tensile stress.

Some embodiments provide that the reacting gas includes $SiH_4$ and $NH_3$, and the atmospheric gas includes at least one gas selected from the group consisting of nitrogen, argon and helium. In some embodiments, the hydrogen gas is introduced by about 5% to about 700% of a total inflowing amount of the reacting gas.

Some embodiments provide that the single crystalline silicon substrate and the silicon germanium channel layer have the same channel direction. In some embodiments, about 10% to about 60% of germanium is included in the silicon germanium channel layer during forming the silicon germanium channel layer. Some embodiments provide that each of the conductive layer patterns included in the first and second gate structures includes the same metal material. In some embodiments, each of the conductive layer patterns includes a different work function.

Some embodiments provide that forming the first gate structure and the second gate structure includes forming a gate oxide layer including metal oxide having a high dielectric property and a conductive layer including a metal on the single crystalline silicon substrate and the silicon germanium channel layer, forming a first thin film on a portion of an upper surface of the conductive layer for controlling a threshold voltage and a second thin film on a remaining region of the upper surface of the conductive layer for controlling the threshold voltage, and forming a polysilicon layer and a hard mask pattern on the first and second thin films. The polysilicon layer, the conductive layer and the gate oxide layer may be patterned to form the first and second gate structures.

Some embodiments include forming a spacer on a side wall of each of the first and second gate structures and forming a metal silicide pattern contacting the first and second impurity regions and an upper surface of the polysilicon layer pattern. In some embodiments, the gate oxide layer pattern includes at least one selected from the group consisting of $HfO_2$, $Al_2O_3$, $ZrO_2$, $Y_2O_3$, $La_2O_3$, $Ta_2O_3$ and $TiO_2$, and the conductive layer pattern includes titanium.

Some embodiments as disclosed herein include methods of manufacturing a transistor. Such methods may include forming a silicon germanium channel layer in a portion of a single crystalline silicon substrate, forming a PMOS transistor on the silicon germanium channel layer, and forming a silicon nitride layer that is operable to remove dangling bonds from an inner portion and/or a surface portion of the silicon germanium channel layer and to apply a tensile stress, the silicon nitride layer being formed using a deposition gas including a reacting gas, an atmospheric gas and a hydrogen gas on surface of the single crystalline silicon substrate, the silicon germanium channel layer and the PMOS transistor.

In some embodiments, the hydrogen gas is introduced by about 5% to about 700% of a total inflowing amount of the reacting gas. Some embodiments provide that the reacting gas includes $SiH_4$ and $NH_3$, and the atmospheric gas includes at least one gas selected from the group consisting of nitrogen, argon and helium.

In some embodiments, forming the silicon germanium channel layer includes forming a mask pattern selectively exposing the PMOS region in the single crystalline silicon substrate and performing a selective and epitaxial growing process to form the silicon germanium channel layer on the exposed single crystalline silicon substrate. In some embodiments, the single crystalline silicon substrate and the silicon germanium channel layer have the same channel direction.

Some embodiments provide that forming the PMOS transistor includes forming a gate oxide layer including metal oxide having a high dielectric property, a conductive layer including a metal, a polysilicon layer and a hard mask pattern on the silicon germanium channel layer, etching the polysilicon layer, the conductive layer and the gate oxide layer to form a gate structure including a gate oxide layer pattern, a conductive layer pattern and a polysilicon layer pattern, and doping p-type impurities into the silicon germanium channel layer at both sides of the gate structure to form an impurity doped region.

Some embodiments include forming a metal silicide pattern contacting the impurity doped region and an upper surface of the polysilicon layer pattern. In some embodiments, methods may include forming an NMOS transistor using the single crystalline silicon substrate as a channel on the single crystalline silicon substrate. Some embodiments provide that about 10% to about 60% of germanium is included in the silicon germanium channel layer during forming the silicon germanium channel layer.

According to example embodiments, a CMOS transistor may include an NMOS transistor having a silicon channel and a PMOS transistor having a silicon germanium channel. For the NMOS transistor, a strained stress may be applied to the silicon channel, and so an electron mobility may increase to show good operating characteristics. In addition, for the PMOS transistor, a number of dangling bonds at the interface of the silicon germanium layer provided as the channel may decrease to restrain scattering of holes due to the dangling bonds. Therefore, the PMOS transistor may also show good operating characteristics.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

Example embodiments will be more clearly understood from the following detailed description taken in conjunction with the accompanying drawings.

FIG. 1 is a cross-sectional view illustrating a PMOS transistor in accordance with some embodiments described herein.

FIGS. 2 to 4 are cross-sectional views for explaining a method of manufacturing a PMOS transistor in FIG. 1.

FIG. 5 is a cross-sectional view illustrating a CMOS transistor in accordance with some embodiments described herein.

FIGS. 6 to 11 are cross-sectional views for explaining a method of manufacturing a CMOS transistor in FIG. 5.

FIG. 12 illustrates a lattice structure of a silicon germanium channel layer including dangling bonds.

FIG. 13 illustrates a lattice structure of a silicon germanium channel layer in accordance with some embodiments described herein.

FIG. 14 is a FT-IR spectrum of a silicon nitride layer in Sample and Comparative Sample.

FIG. 15 illustrates a plasma damage monitoring voltage of a silicon germanium channel layer in Sample and Comparative Sample.

FIG. 16 illustrates an interface trap density of a silicon germanium channel layer in Sample and Comparative Sample.

FIG. 17 is a plan view of a CMOS inverter in accordance with some embodiments described herein.

FIG. 18 is a cross-sectional view cut along a line I-I' in FIG. 17.

FIG. 19 is a cross-sectional view for explaining methods of manufacturing a CMOS inverter in FIGS. 17 and 18.

DETAILED DESCRIPTION OF THE EMBODIMENTS

Figure 1:
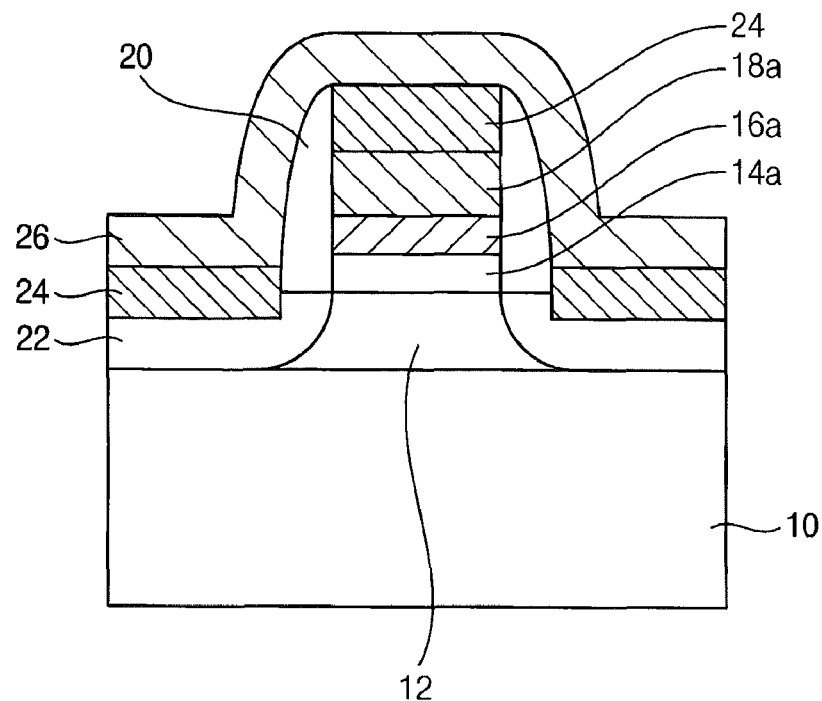
FIGS. 1 to 19 represent example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of transistors and methods of manufacturing transistors will be explained in detail.

Reference is now made to FIG. 1, which is a cross-sectional view of a PMOS transistor in accordance with some embodiments described herein. A substrate 10 may be provided. On an upper surface of the substrate 10, a silicon germanium layer 12 may be formed in a first channel direction such as (100) channel direction. The silicon germanium layer 12 may have a thickness of about 50 Å to about 300 Å. Some embodiments provide that may provide that the germanium layer may have a thickness of about 10% to about 60% of germanium may be included in the silicon germanium layer 12 and in some embodiments, about 10% to about 30% of germanium may be included. Some embodiments provide that the PMOS transistor may include a channel may be formed under an upper surface of the silicon germanium layer 12.

Hydrogen may be included in the silicon germanium layer 12 and at an interface of a gate oxide layer pattern 14a and the silicon germanium layer 12. That is, Si—H and/or Ge—H bonds may be included in and on the silicon germanium layer 12. The Si—H and/or the Ge—H bonds may be obtained through combining of dangling bonds of silicon or germanium with the hydrogen.

On the silicon germanium layer 12, a gate oxide layer pattern 14a formed using metal oxide having a high dielectric property may be provided. In this case, the high dielectric property of the metal oxide may represent a higher value than that of silicon nitride. The gate oxide layer pattern 14a may be formed by using at least one of $HfO_2$, $Al_2O_3$, $ZrO_2$, $Y_2O_3$, $La_2O_3$, $Ta_2O_3$, $TiO_2$ and a mixture thereof, and/or an integrated structure including at least two layers of them.

On the gate oxide layer pattern 14a, a gate electrode 16a formed using a metal material may be formed. The metal material may have an appropriate work function so that a transistor that is manufactured therewith may have a target threshold voltage. For example, the metal material may include aluminum (Al) doped titanium nitride, titanium nitride and/or titanium, among others.

When the gate oxide layer pattern 14a is formed using metal oxide having a high dielectric property, the gate electrode directly contacting the gate oxide layer pattern 14a may not be formed using polysilicon. When the gate oxide layer pattern 14a is formed using the metal oxide and the gate electrode is formed using polysilicon, a Fermi level of polysilicon contacting the metal oxide may not change but may be fixed to a certain position. That is, Fermi level pinning phenomenon may be generated even though impurity doped polysilicon may be used. Therefore, the gate electrode 16a directly contacting the gate oxide layer pattern 14a may be formed using the above described metal materials.

On the gate electrode 16a, a polysilicon pattern 18a and a metal silicide pattern 24 may be provided. In addition, on side walls of the gate electrode 16a, the polysilicon pattern 18a and the metal silicide pattern 24, a spacer 20 may be formed.

At both sides of the gate electrode 16a and under the surface portion of the silicon germanium layer 12, a p-type impurity doped source/drain 22 may be formed.

On the polysilicon pattern 18a and the source/drain 22, the metal silicide pattern 24 contacting the polysilicon pattern 18a and the source/drain 22 may be provided. Some embodiments provide that the source/drain 22 may be formed to include a height that is substantially similar to the silicon germanium layer 12 in a portion that is below the spacer 20.

On and along the upper surface of the silicon germanium layer 12, the spacer 20, the gate electrode 16a, the polysilicon pattern 18a and the metal silicide pattern 24, an etch stopping layer 26 may be formed. The etch stopping layer 26 may be formed using silicon nitride.

As described above, the PMOS transistor may be formed on the silicon germanium layer 12. Therefore, the gate electrode 16a of the PMOS transistor may be formed using a metal material having a low work function when comparing with that formed on silicon. In addition, within and on the silicon germanium layer 12, Si—H bonds and/or Ge—H bonds may be formed to decrease a number of dangling bonds and to prevent scattering of holes. Accordingly, the PMOS transistor in accordance with this example embodiment may show good operating characteristics.

Figure 2:
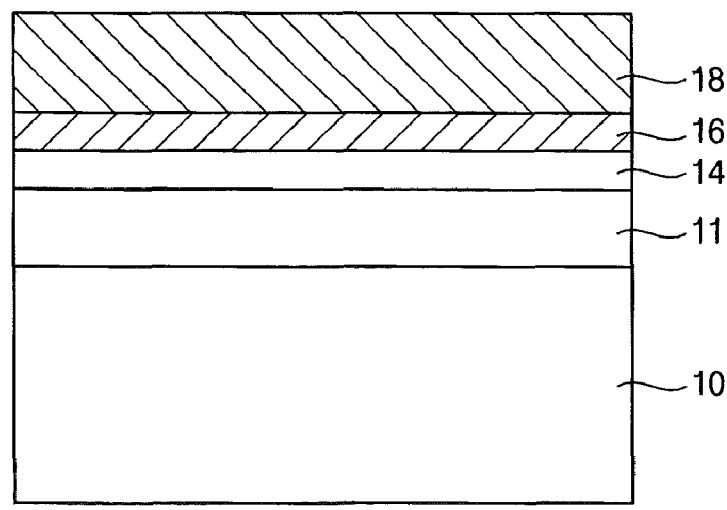
Figure 3:
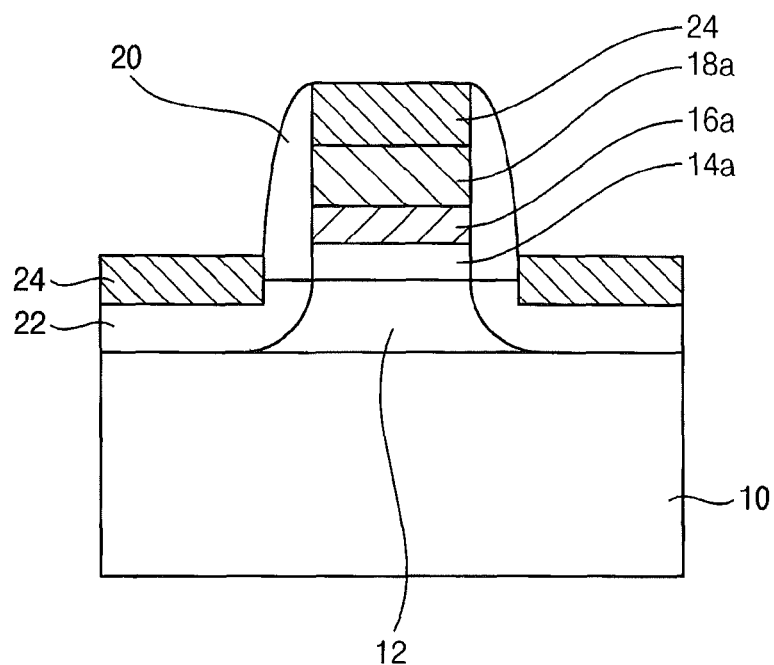
Figure 4:
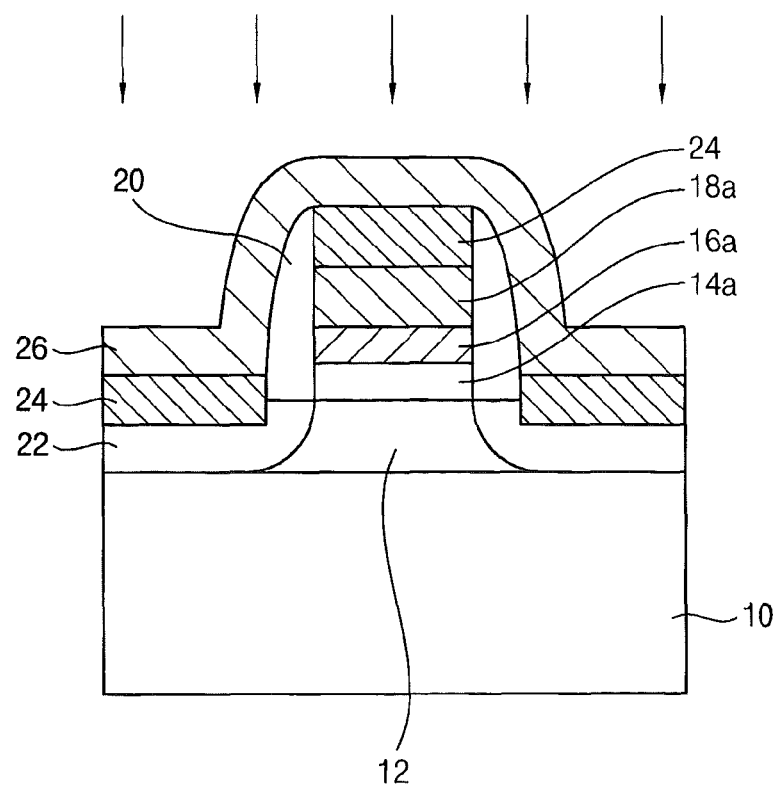

FIGS. 2 to 4 are cross-sectional views for explaining methods of manufacturing a PMOS transistor as described above regarding in FIG. 1.

Referring to FIG. 2, a preliminary silicon germanium layer 11 having the first channel direction may be formed on a single crystalline silicon substrate 10. In some embodiments, the preliminary silicon germanium layer 11 may be formed through a selective and epitaxial growing process. Some embodiments provide that the preliminary silicon germanium layer 11 may be formed to a thickness of about 50 Å to about 300 Å. In the silicon germanium layer 11, about 10% to about 60% of germanium may be included so that silicon germanium in the silicon germanium layer 11 may have a single crystallinity.

On the preliminary silicon germanium layer 11, metal oxide having a high dielectric property may be deposited to form a gate oxide layer 14. A metal layer 16 for a gate electrode may be formed on the gate oxide layer 14. Then, a polysilicon layer 18 may be formed on the metal layer 16.

Referring to FIG. 3, an etching mask pattern may be formed on the polysilicon layer 18. The polysilicon layer 18, the metal layer 16 and the gate oxide layer 14 may be etched one by one using the etching mask pattern. A preliminary gate structure including a laminated structure of a gate oxide layer pattern 14a, a gate electrode 16a and a preliminary polysilicon pattern (not shown) may be formed. A spacer 20 may be formed on both side walls of the preliminary gate structure.

In some embodiments, p-type impurities may be doped to form a source/drain region 22 in the surface of the preliminary silicon germanium layer 11 and at both sides of the preliminary gate structure.

At least a portion of the preliminary polysilicon pattern and the upper surface of the source/drain region 22 may react with a metal to form a polysilicon pattern 18a and a metal silicide pattern 24. Some embodiments provide that the etching mask pattern may be removed and a metal layer (not shown) may be formed along surfaces of the preliminary silicon germanium layer 11, the spacer 20 and the polysilicon pattern 18a. The metal layer may react with the surface portions of the polysilicon pattern 18a and the preliminary silicon germanium layer 11 to form a metal silicide pattern 24.

Referring to FIG. 4, an etch stopping layer 26 may be formed along upper surfaces of the preliminary silicon germanium layer 11, the spacer 20, the gate electrode 16a, the polysilicon pattern 18a and the metal silicide pattern 24. Some embodiments provide that the etch stopping layer 26 may be formed using a silicon nitride.

A deposition gas for forming the silicon nitride may include a reacting gas, an atmospheric gas and/or a hydrogen gas. The reacting gas may include a silicon source gas and/or a nitrogen source gas, such as silane ($SiH_4$) and ammonia ($NH_3$), among others. The atmosphere gas may control a pressure condition of a chamber and may include nitrogen, argon, and/or helium, among others. These gases may be used alone or as a mixture of two or more. The hydrogen gas may be provided to make bonds with dangling bonds at the interface or inner portion of the preliminary silicon germanium channel layer 11. In this regard, an inflowing amount of the hydrogen gas may be controlled so that whole dangling bonds at the inner portion and the upper surface of the preliminary silicon germanium channel layer 11 may react with hydrogen. For example, the hydrogen gas may inflow by about 5% to about 700% of the reacting gas and/or about 50% to about 200% of the reacting gas.

As described above, during a formation of the etch stopping layer 26, the hydrogen gas may be introduced to remove the dangling bonds from the inner portion and the surface portion of the silicon germanium layer 12.

Figure 5:
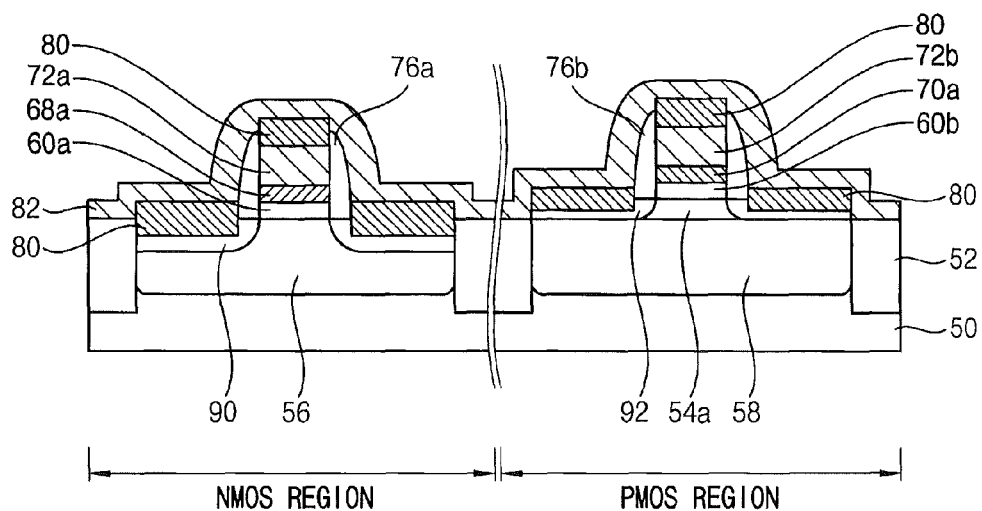

Reference is now made to FIG. 5, which is a cross-sectional view illustrating a CMOS transistor in accordance with some embodiments described herein. A substrate 50 including a single crystalline silicon may be provided. The substrate 50 may have the first channel direction.

The surface portion of the substrate 50 may be divided into a device isolation region and an active region. The substrate 50 may also be divided into an NMOS region and a PMOS region. In the NMOS region of the substrate 50, an NMOS transistor may be formed and in the PMOS region of the substrate 50, a PMOS transistor may be formed.

The NMOS transistor may include a first gate oxide layer pattern 60a formed using a metal oxide having a high dielectric property on the surface of the substrate 50 in the NMOS region. A channel layer of the NMOS transistor may be formed using a single crystalline silicon material. The first gate oxide layer pattern 60a may include at least one layer of $HfO_2$, $Al_2O_3$, $ZrO_2$, $Y_2O_3$, $La_2O_3$, $Ta_2O_3$, $TiO_2$ and/or a mixture of them, or may include an integrated structure of them.

On the first gate oxide layer pattern 60a, a first gate electrode 68a including a metal material may be formed. The first gate electrode 68a may be formed using a metal material having a low work function. For example, the first gate electrode may include work functions of less than about 4.4 eV. In this manner, a threshold voltage for NMOS transistor may be about 0.2 to about 0.7 V. Some embodiments provide that a metal material having a higher work function than about 4.4 eV doped with a metal material having a low work function may be used. For example, the first gate electrode may be formed using lanthanum (La) doped titanium nitride and/or lanthanum (La) doped titanium. Titanium nitride has a work function of about 4.6 eV and titanium has a work function of about 4.33 eV.

On the first gate electrode 68a, a first polysilicon pattern 72a may be provided. On the first polysilicon pattern 72a, a metal silicide pattern 80 may be provided. The metal silicide pattern 80 may be formed using nickel silicide, tungsten silicide, cobalt silicide, etc.

A first spacer 76a may be formed on side wall portion of a first gate structure having an integrated structure of the first gate oxide layer pattern 60a, the first gate electrode 68a, the first polysilicon pattern 72a and/or the metal silicide pattern 80. The first spacer 76a may be formed using silicon nitride.

As described above, the first gate oxide layer pattern 60a may be formed using the metal oxide having a high dielectric property. Accordingly, the thickness of the first gate oxide layer pattern 60a may be sufficiently large and a rapid operating speed may be maintained. In addition, a channel length of the NMOS transistor may be decreased.

Under the surface of the substrate and at both sides of the first gate structure, a first impurity region 90 doped with n-type impurities may be formed. The first impurity region 90 may be provided as a source/drain of the NMOS transistor.

The metal silicide pattern 80 may be provided on the first impurity region 90.

The first spacer 76a and the first gate structure, a silicon nitride layer 82 may be formed on and along the surface of the substrate 50. The silicon nitride layer 82 may be used as an etch stopping layer during a subsequent etching process. A tensile stress may be applied on the substrate of the NMOS transistor channel due to the silicon nitride layer 82. Some embodiments provide that the silicon nitride layer 82 may have about 0.5 Gpa or more of a stress in some embodiments.

Because of the tensile stress applied to the surface portion of the substrate by the silicon nitride layer 82, an electron mobility of the NMOS transistor may be increased. Accordingly, the NMOS transistor may show good operating characteristics.

The PMOS transistor may be formed on the surface of the substrate 50 in the PMOS region and on a silicon germanium channel layer 54a. The silicon germanium channel layer 54a may have the first channel direction. When about 10% or less of germanium is included in the silicon germanium channel layer 54a, a threshold voltage of the PMOS transistor may be difficult to control. When about 60% or more of germanium is included in the silicon germanium channel layer 54a, a single crystallinity of the silicon germanium channel layer may not be maintained and a hole mobility of the PMOS transistor may be decreased. Accordingly, some embodiments include about 10% to about 60% of germanium in the silicon germanium channel layer 54a and/or about 10% to about 30% of germanium in the layer 54a.

When the thickness of the silicon germanium channel layer 54a is smaller than about 50 Å, the layer may not function as the channel layer. When the thickness of the silicon germanium channel layer is larger than about 300 Å, crystalline defects may increase in the layer. Some embodiments provide that the silicon germanium channel layer 54a may have a thickness of about 50 Å to about 300 Å. In some embodiments, the silicon germanium layer may have a thickness of about 100 Å to about 150 Å.

Since the PMOS transistor may have a different threshold voltage from that of the NMOS transistor, a different channel layer may be employed for the PMOS transistor from the channel layer of the NMOS transistor so that the PMOS transistor may have an appropriate threshold voltage. Silicon may have a band gap of about 1.12 eV and germanium may have a band gap of about 0.66 eV. For silicon germanium, a band gap of the silicon germanium layer may be controlled by adjusting an amount of the germanium included in the silicon germanium layer so that the silicon germanium may have a lower band gap than that of silicon. When the silicon germanium layer 54a having such low band gap is used as the channel layer, a conductive material having a relatively low work function may be used as the gate electrode. In this case, a desired threshold voltage may be obtainable. Therefore, some embodiments provide that the same metal material used for the first gate electrode in the NMOS transistor may be used for forming the gate electrode of the PMOS transistor.

A second gate oxide layer pattern 60b formed by using metal oxide having a high dielectric property may be formed. The second gate oxide layer pattern 60b may be formed by using the same material as the first gate oxide layer pattern.

A second gate electrode 70a formed using a metal material may be provided on the second gate oxide layer pattern 60b. The second gate electrode 70a may include the same metal material as the first gate electrode 68a. Some embodiments provide that the metal material doped into the metal material of the second gate electrode 70a may be different from the metal material of the first gate electrode 68a. For example, the second gate electrode 70a may be formed using aluminum (Al) doped titanium nitride. In some embodiments, the second gate electrode 70a may be formed using titanium nitride and/or titanium.

A second polysilicon pattern 72b may be formed on the second gate electrode 70a. A metal silicide pattern 80 may be formed on the second polysilicon pattern 72b.

A second spacer 76b may be formed on a side wall portion of a second gate structure obtained by integrating the second gate oxide layer pattern 60b, the second gate electrode 70a, the second polysilicon pattern 72b and/or the metal silicide pattern 80. Some embodiments provide that the second spacer 76b may be formed using silicon nitride.

A second impurity region 92 doped with p-type impurities may be formed under the surface portion of the silicon germanium channel layer 54a and at both sides of the second gate structure. The second impurity region 92 may serve as a source/drain of the PMOS transistor.

The metal silicide pattern 80 may be provided on the second impurity region 92.

Some embodiments provide that hydrogen may be included in the silicon germanium channel layer 54a and at the surface of the silicon germanium channel layer 54a. Dangling bonds may react with hydrogen atoms at an inner portion and surface portion of the silicon germanium channel layer 54a to form Si—H bonds and/or Ge—H bonds at the inner portion and surface portion of the silicon germanium channel layer 54a. Because of the hydrogen atoms, the quantity of sites of the dangling bonds at the inner portion and the surface portion of the silicon germanium channel layer 54a may be decreased. In this regard, scattering of holes, that is carriers of the PMOS transistor, due to the dangling bonds may be prevented.

A silicon nitride layer 82 may be formed on the upper surface portion of the silicon germanium channel layer 54a, the second spacer 76b and the second gate structure. The silicon nitride layer 82 may be formed using the same material used for the formation of the silicon nitride layer in the NMOS transistor. A tensile stress may also be applied to the silicon germanium channel layer 54a by the silicon nitride layer 82.

A mobility of holes of the PMOS transistor may be decreased through the application of the tensile stress. In order to prevent a performance deterioration of the PMOS transistor due to the tensile stress, the PMOS transistor may be formed on the substrate having the first channel direction. In the silicon germanium channel layer 54a formed on the substrate, the hole mobility of the PMOS transistor may change little even though the tensile stress may be applied by the silicon nitride layer 82. This result may be obtainable because the tensile stress may be applied in a direction that is different from the channel direction of the PMOS transistor.

Generally, performance of the PMOS transistor with the application of the tensile stress by the silicon nitride layer may be somewhat lowered when comparing with the PMOS transistor without the application of the tensile stress, even though the substrate having the first channel direction may be used. A ratio of a turn-on current and a turn-off current (Ion/Ioff) of the PMOS transistor including the commonly formed silicon nitride and receiving the tensile stress may be lowered by at least about 5% when comparing with a ratio of a turn-on current and a turn-off current (Ion/Ioff) of the PMOS transistor not including the silicon nitride layer and not receiving the tensile stress.

However, according to some embodiments, the dangling bonds may be decreased at the inner portion and the surface portion of the silicon germanium channel layer 54a through the formation of the Si—H bonds and/or the Ge—H bonds and so the scattering of the holes may be prevented as described above. Therefore, the lowering of the ratio of a turn-on current and a turn-off current (Ion/Ioff) may be restrained. A ratio of a turn-on current and a turn-off current (Ion/Ioff) of the PMOS transistor in accordance with some embodiments may be different by at least 5% from the ratio of a turn-on current and a turn-off current (Ion/Ioff) of the common PMOS transistor without receiving the tensile stress. For the PMOS transistor including the silicon nitride layer 82 applying the tensile stress in accordance with some embodiments, operating characteristics may not be substantially deteriorated.

The NMOS transistor included in the CMOS transistor may be provided on silicon receiving the tensile stress as described above. Accordingly, the NMOS transistor may have a rapid electron mobility. Further, the PMOS transistor included in the CMOS transistor may be provided on the silicon germanium channel layer and may show good operating characteristics.

FIGS. 6 to 11 are cross-sectional views for explaining methods of manufacturing a CMOS transistor in FIG. 5.

Figure 6:
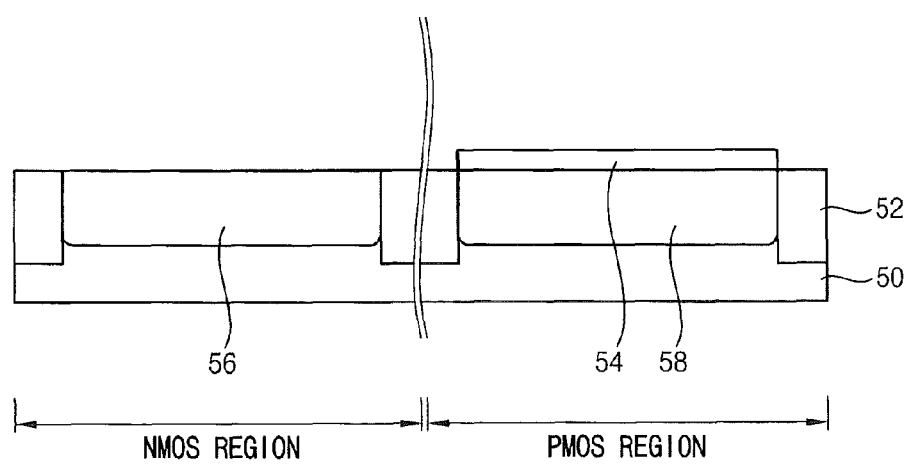

Referring to FIG. 6, a substrate 50 including a single crystalline silicon may be provided. The substrate 50 may have a first channel direction. The substrate 50 may be divided into an NMOS region and a PMOS region.

On the substrate 50, a trench device isolation process may be performed to form a device isolation layer pattern 52 to divide a surface portion of the substrate 50 into a device isolation region and an active region.

Then, a first mask pattern (not shown) may be formed on the substrate 50 for selectively exposing the PMOS region of the substrate 50. A selective and epitaxial growing process may be performed with respect to the exposed PMOS region of the substrate 50 to form a preliminary silicon germanium channel layer 54. The preliminary silicon germanium channel layer 54 may be selectively formed in the active region on the surface of the substrate 50 in the PMOS region.

Particularly, a silicon germanium base epitaxial layer may be formed on the substrate 50 using a reacting gas including dichlorosilane ($SiH_2Cl_2$), germane ($GeH_4$) and/or hydrochloric acid (HCl). Silicon germanium may be grown from the silicon germanium base epitaxial layer to form the preliminary silicon germanium channel layer 54. The preliminary silicon germanium channel layer 54 may have the same first channel direction as the substrate.

The flowing amount of the germanium source gas, $GeH_4$, may be controlled so that about 10% to about 60% of germanium may be included in the preliminary silicon germanium channel layer 54. In some embodiments, about 10% to about 30% of germanium may be included in the preliminary silicon germanium channel layer 54. Some embodiments provide that the thickness of the preliminary silicon germanium channel layer 54 may be about 50 Å to about 300 Å.

To form each channel region of the NMOS and PMOS transistors, p-type impurities may be doped into the substrate 50 of the NMOS region and n-type impurities may be doped into the preliminary silicon germanium channel layer 54 of the PMOS region. In some embodiments, a first ion doping mask pattern (not shown) selectively exposing the NMOS region may be formed and then, the p-type impurities may be doped into the substrate 50 in the NMOS region. The first ion doping mask pattern may be removed. A second ion doping mask pattern (not shown) selectively exposing the substrate 50 of the PMOS region may be formed. Then, the n-type impurities may be doped into the substrate 50 in the PMOS region. The second ion doping mask pattern may be removed. A P-well 56 and an N-well 58 served as the channel region may be formed. The first and second ion doping mask patterns may be formed using a photoresist. The p-type impurities may include boron, boron difluoride ($BF_2$), etc., and the n-type impurities may include arsenic, phosphorous, etc.

Figure 7:
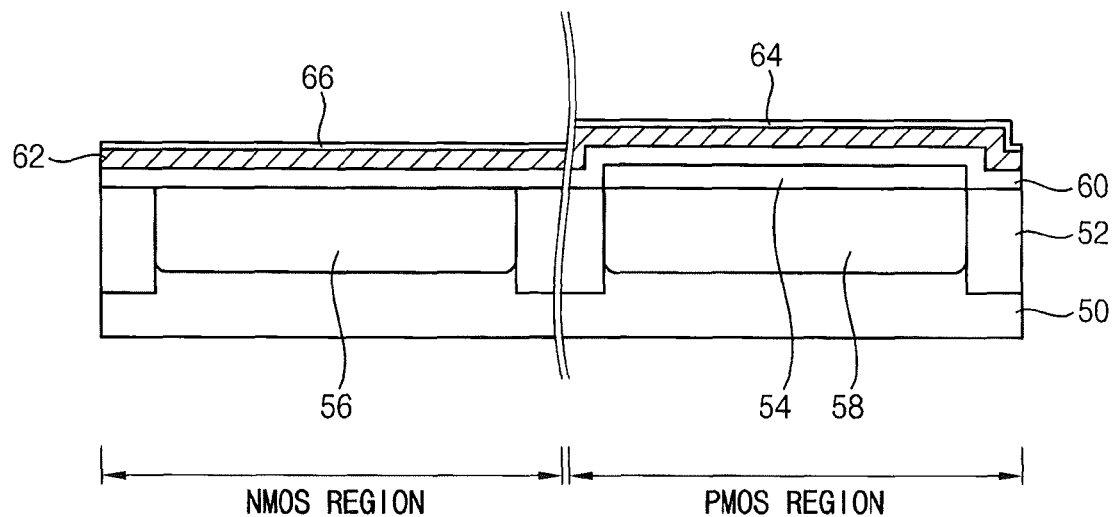

Referring to FIG. 7, metal oxide having a high dielectric property may be deposited on the substrate 50 and the preliminary silicon germanium channel layer 54 to form a gate oxide layer 60. Some embodiments provide that the metal oxide may include at least one of $HfO_2$, $Al_2O_3$, $ZrO_2$, $Y_2O_3$, $La_2O_3$, $Ta_2O_3$, $TiO_2$ and a mixture thereof and the gate oxide layer may include an integrated structure of them.

On the gate oxide layer 60, a conductive layer 62 for a gate electrode may be formed. The conductive layer 62 for the gate electrode may be formed using a metal material. The conductive layer 62 formed on the silicon substrate 50 may serve as a gate electrode of the NMOS transistor and the conductive layer 62 formed on the preliminary silicon germanium channel layer 54 may serve as a gate electrode of the PMOS transistor. Accordingly, the conductive layer 62 may be formed using a material having a work function satisfying a desired threshold voltage of both of the NMOS transistor and the PMOS transistor. In accordance with some embodiments, the conductive layer 62 may be formed using titanium nitride.

On the conductive layer 62 for the gate electrode, an aluminum layer (not shown) may be deposited to a thickness of several Å to dozens of Å. The aluminum layer formed in the NMOS region may be selectively removed to form an aluminum pattern 64 on the conductive layer 62 for gate electrode formed in the PMOS region. Aluminum atoms in the aluminum pattern 64 may diffuse into the titanium nitride through subsequent processes accompanying heat to function as a dopant for controlling the threshold voltage of the PMOS transistor.

Further, on the conductive layer 62 for the gate electrode, a lanthanum layer (not shown) may be deposited to a thickness of several Å to dozens of Å. The lanthanum layer formed in the PMOS region may be selectively removed to form a lanthanum pattern 66 on the conductive layer 62 for the gate electrode formed in the NMOS region. Lanthanum atoms in the lanthanum pattern 66 may diffuse into the titanium nitride through subsequent processes accompanying heat to function as a dopant for controlling the threshold voltage of the NMOS transistor.

Figure 8:
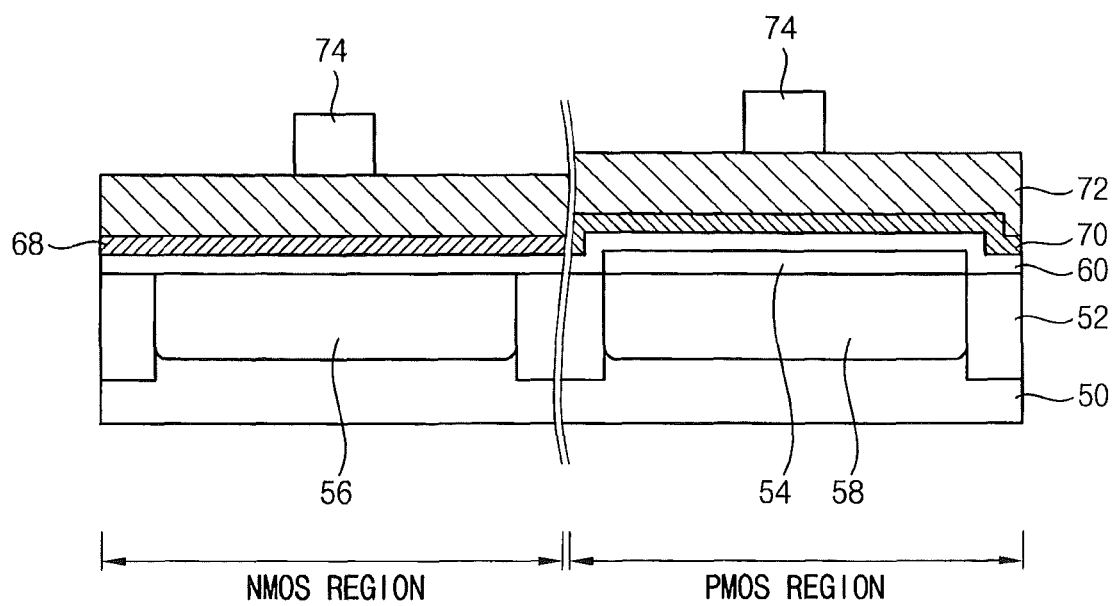

Referring to FIG. 8, a polysilicon layer 72 may be formed on the aluminum pattern 64 and the lanthanum pattern 66. On the polysilicon layer 72, an etching mask pattern 74 for forming a preliminary first gate structure and a preliminary second gate structure may be formed. The etching mask pattern 74 may be formed using silicon nitride or silicon oxide.

During a formation of the polysilicon layer 72 and the etching mask pattern 74, the lanthanum atoms included in the lanthanum pattern 66 may diffuse into the titanium nitride to form a first gate electrode layer 68. In addition, the aluminum atoms included in the aluminum pattern 64 may diffuse into the titanium nitride to form a second gate electrode layer 70.

Figure 9:
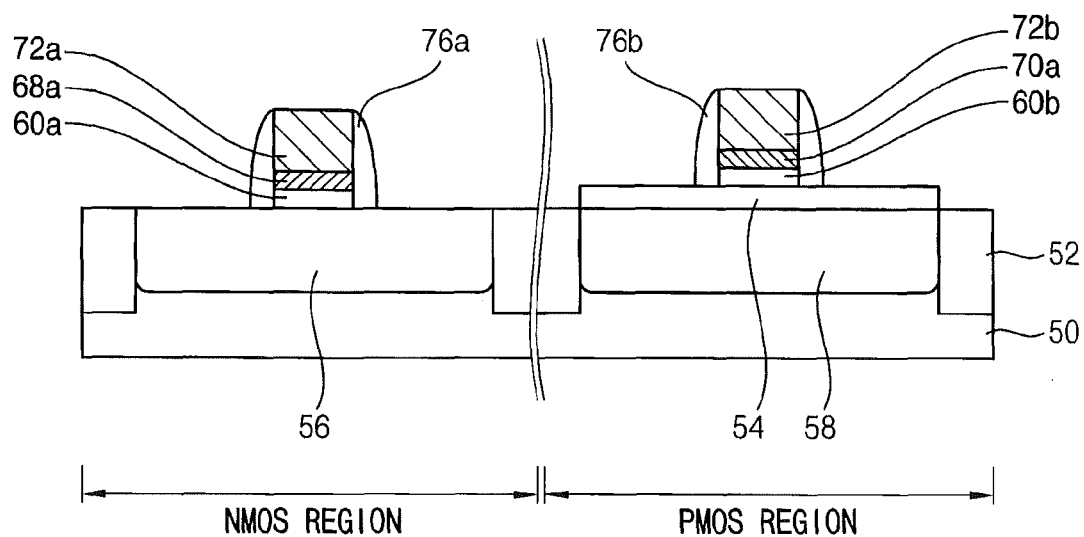

Referring to FIG. 9, the polysilicon layer 72, the first and the second gate electrode layers 68 and 70 and the gate oxide layer 60 may be continuously and anisotropically etched using the etching mask pattern 74. By virtue of the etching process, a preliminary first gate structure including a first gate oxide layer pattern 60a, a first gate electrode 68a, a first polysilicon pattern 72a and an etching mask pattern (not shown) may be formed on the substrate in a first region. On the preliminary silicon germanium channel layer 54 in the second region, a preliminary second gate structure including a second gate oxide layer pattern 60b, a second gate electrode 70a, a second polysilicon pattern 72b and an etching mask pattern (not shown) may be formed.

A spacer layer (not shown) covering a surface portion of the preliminary first and second gate structures and an upper surface of the substrate 50 and the preliminary silicon germanium channel layer 54 may be formed. Some embodiments provide that the spacer layer may be formed using a silicon nitride. The spacer layer may be anisotropically etched to form a first spacer 76a and a second spacer 76b on side walls of the preliminary first and second gate structures.

The etching mask pattern deposited for forming the preliminary first and second gate structures may be removed. Accordingly, uppermost first and second polysilicon patterns 72a and 72b of the preliminary first and second gate structures may be exposed.

Figure 10:
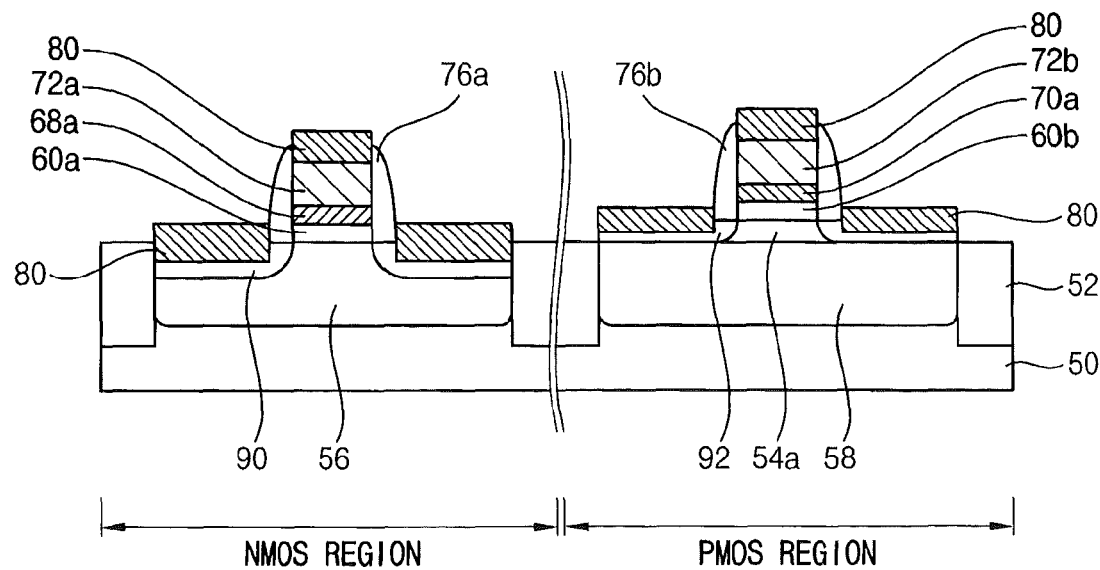

Referring to FIG. 10, a third ion doping mask pattern (not shown) for selectively exposing a surface portion of the substrate 50 in the NMOS region may be formed on the substrate. The third ion doping mask pattern may be formed as a photoresist pattern. N-type impurities may be doped into the NMOS region using the third ion doping mask pattern as an ion doping mask. Under the surface portion of the substrate 50 exposed at both sides of the preliminary first gate structure, a first impurity region 90 that serves as a source/drain may be formed. In this case, the n-type impurities may be doped into the first polysilicon pattern 72a. Then, the third ion doping mask pattern may be removed.

On the substrate 50, a fourth ion doping mask pattern (not shown) for selectively exposing the surface portion of the substrate 50 in the PMOS region may be formed. P-type impurities may be doped into the preliminary silicon germanium channel layer 54 in the PMOS region using the fourth ion doping mask pattern as an ion doping mask. Under the surface portion of the preliminary silicon germanium channel layer 54 exposed at both sides of the preliminary second gate structure, a second impurity region 92 that serves as a source/drain may be formed. In this case, the p-type impurities may be doped into the second polysilicon pattern 72b. Then, the fourth ion doping mask pattern may be removed.

Subsequently, a metal layer (not shown) may be formed along surfaces of the substrate 50, the first and second spacers 76a and 76b, the first and second polysilicon patterns 72a and 72b and the preliminary silicon germanium channel layer 54. The metal layer may be deposited to form a metal silicide pattern 80 on surfaces of the first and second impurity regions 90 and 92 and the first and second polysilicon patterns 72a and 72b. Particularly, the metal layer may be formed using a metal material including nickel, cobalt, and/or tungsten, among others.

The metal layer may be heat treated so that the metal layer may react with silicon. The metal silicide pattern 80 may be formed on surfaces of the first and second impurity regions 90 and 92 and the first and second polysilicon patterns 72a and 72b, respectively. The metal layer formed on the first and second spacers 76a and 76b and the device isolation layer pattern 52 may not undergo a silicide reaction and thus may remain. The unreacting and remaining metal layer may be removed.

A first gate structure including an integrated structure of the first gate electrode 68a, the first polysilicon pattern 72a and the metal silicide pattern 80 and a second gate structure including an integrated structure of the second gate electrode 70a, the second polysilicon pattern 72b and the metal silicide pattern 80 may be respectively formed.

To decrease a resistance of the gate and the source/drain of the transistor, the metal silicide pattern 80 may be formed. Some embodiments provide that the forming process of the metal silicide pattern 80 may be omitted to simplify a manufacturing process.

Figure 11:
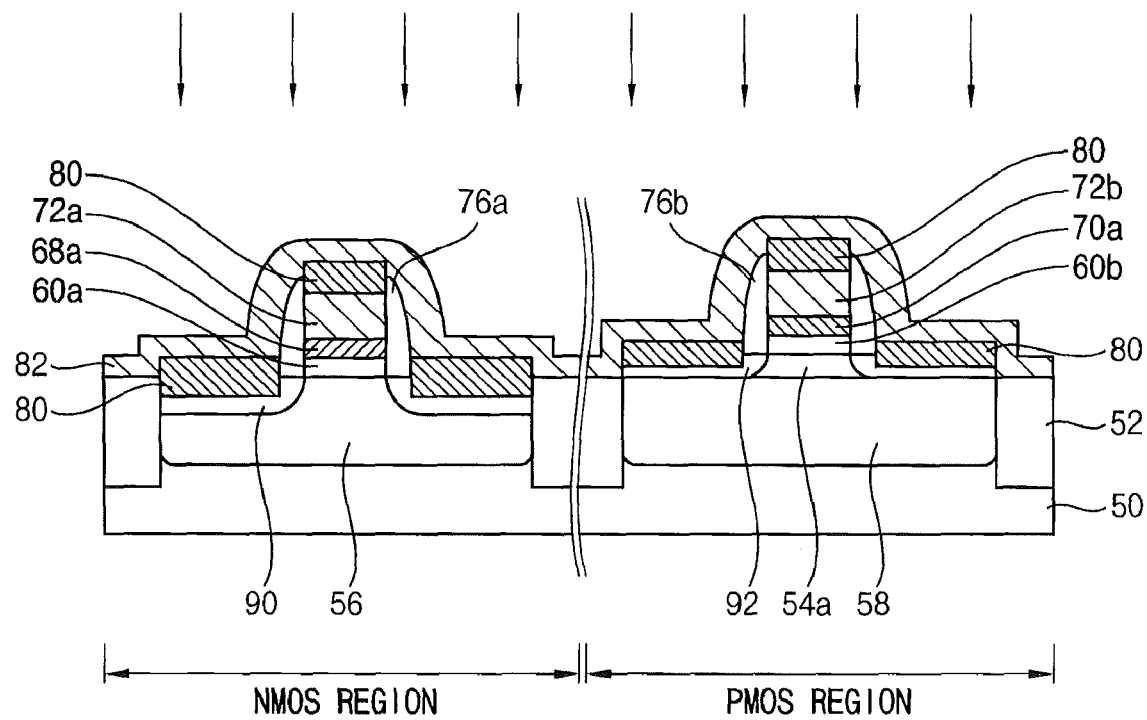

Referring to FIG. 11, a silicon nitride layer 82 may be formed along surface portions of the substrate 50, the metal silicide pattern 80 and the first and second spacers 76a and 76b. The silicon nitride layer 82 may be formed to apply a tensile stress onto the substrate in the NMOS region. Through the formation of the silicon nitride layer 82, the performance of the PMOS transistor may not be lowered.

The silicon nitride layer 82 may be formed through a plasma enhanced-chemical vapor deposition (PE-CVD) process or a high density plasma-CVD (HDP-CVD) process. The depositing process of the silicon nitride layer 82 may be performed in a single wafer type CVD chamber and/or in a batch type chamber.

The silicon nitride layer 82 may be used as an etch stopping layer during a subsequent etching process. In some embodiments, the silicon nitride layer 82 may apply a tensile stress onto the substrate of the channel of the NMOS transistor.

When the deposition temperature of the silicon nitride layer 82 is about 300° C. or less, the deposition of the layer may be difficult. When the deposition temperature of the silicon nitride layer 82 is about 500° C. or over, re-crystallization may be generated in an amorphous region of an underlying layer during the deposition. Accordingly, the deposition process of the silicon nitride layer 82 may be performed in a temperature range of about 300° C. to about 500° C.

Depositing gas for forming the silicon nitride layer 82 may include a reacting gas, an atmospheric gas and/or a hydrogen gas. The reacting gas may include a silicon source gas and a nitrogen source gas, for example, $SiH_4$ and $NH_3$. The atmospheric gas may control the pressure of the chamber and may include nitrogen, argon, and/or helium, among others. These gases may be used alone and/or as a mixture thereof. The hydrogen gas may be provided to make bonds with the dangling bonds generated at the surface portion and inner portion of the preliminary silicon germanium channel layer. Accordingly, an amount of the hydrogen gas may be controlled so that the whole dangling bonds at the inner portion and at the upper surface portion of the preliminary silicon germanium channel layer may combine with hydrogen. For example, an inflowing amount of the hydrogen gas may be about 5% to about 700% of an inflowing amount of the reacting gas. In some embodiments, an inflowing amount of the hydrogen gas may be about 50% to about 200% of the inflowing amount of the reacting gas. Some embodiments provide that an inflowing amount of the hydrogen gas may be about 100 to about 20000 sccm.

Even though the hydrogen gas may inflowed during forming the silicon nitride layer 82, the number of hydrogen atoms or hydrogen bonds within thus formed silicon nitride layer may not increase. The dangling bonds at an upper surface portion of the preliminary silicon germanium channel layer 54 may combine with hydrogen to remove the dangling bonds and to form a silicon germanium channel layer 54a.

Through the above described processes, the high performance CMOS transistor illustrated in FIG. 5 may be manufactured.

Hereinafter, characteristics of the PMOS transistor in accordance with example embodiments may be compared with common PMOS transistors.

Figure 12:
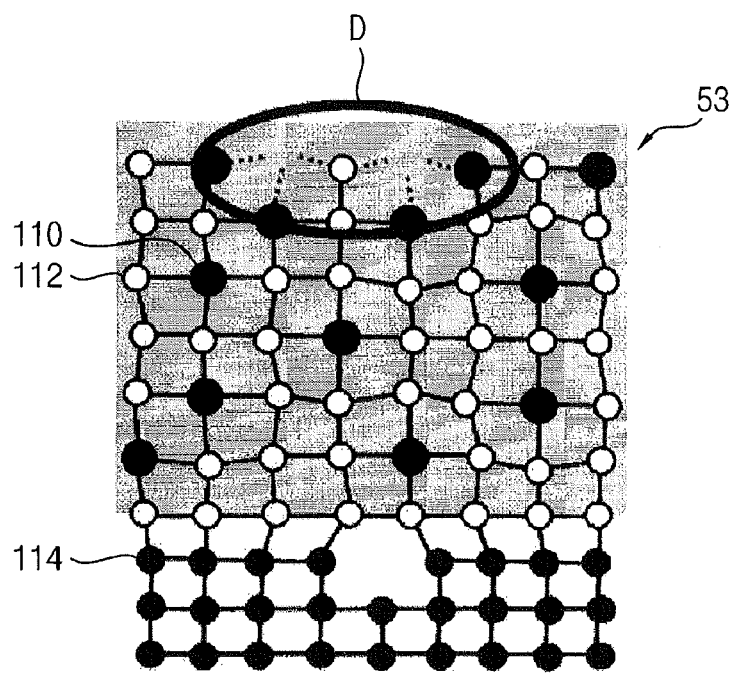

Reference is now made to FIG. 12, which illustrates a lattice structure of a silicon germanium channel layer including dangling bonds. Reference numeral 110 represents germanium, reference numeral 112 represents a strained silicon and reference numeral 114 represents silicon. When the silicon nitride layer for applying the tensile stress is formed as illustrated in FIG. 12, the tensile stress may also be applied to the silicon germanium channel layer 53. Accordingly, a large number of dangling bonds D may be generated at an upper surface portion of the silicon germanium channel layer 53 under the silicon nitride layer.

When the silicon germanium channel layer 53 receives the tensile stress by the silicon nitride layer, Si—Si bonds, Si—Ge bonds or Ge—Ge bonds may be separated from the silicon germanium channel layer 53. The dangling bonds D generated at an upper portion and inner portion of the silicon germanium channel layer 53 may deteriorate a mobility of the PMOS transistor.

Figure 13:
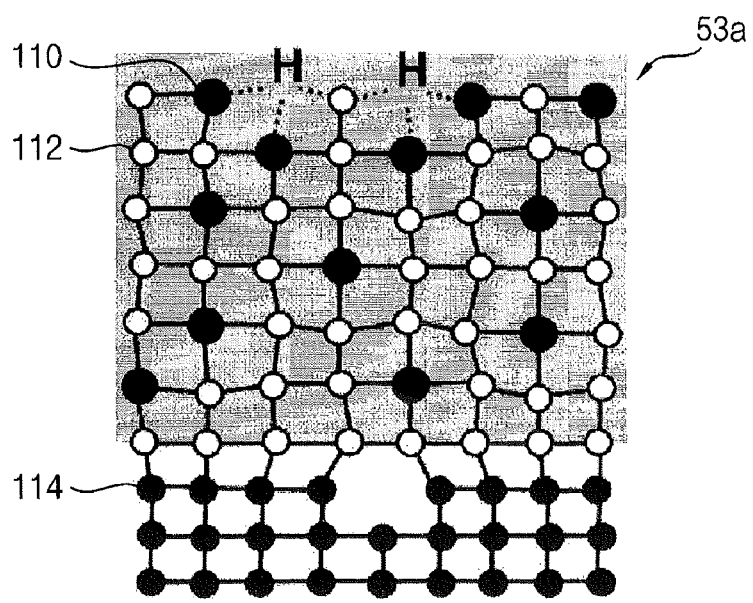

Reference is now made to FIG. 13, which illustrates a lattice structure of a silicon germanium channel layer in accordance with some embodiments disclosed herein. Reference numeral 110 represents germanium, reference numeral 112 represents a strained silicon and reference numeral 114 represents silicon. Dangling bonds at upper surface portion of the silicon germanium channel layer 54a may make bonds with hydrogen and most of the dangling bonds may be removed in accordance with some embodiments.

When a silicon nitride layer is formed in accordance with some embodiments, a silicon germanium channel layer 54a may receive a tensile stress. During forming the silicon nitride layer, hydrogen gas may be introduced so that the hydrogen gas may diffuse to the silicon germanium channel layer 53a. Dangling bonds generated at an upper surface of the silicon germanium channel layer 53a may make bonds with hydrogen and most of the dangling bonds may be removed. By bonding the dangling bonds with hydrogen at the upper surface portion and the inner portion of the silicon germanium channel layer 53a, a mobility of a PMOS transistor may be improved.

Experiment Manufacturing Sample

A CMOS transistor was manufactured in accordance with some embodiments disclosed herein. An NMOS transistor was formed on a silicon substrate 50 having a first channel direction of (100) as illustrated in FIG. 5. In addition, a PMOS transistor was formed on a silicon germanium channel layer 54a having the first channel direction. In the NMOS transistor, a first gate oxide layer pattern 60a was formed using $HfO_2$, and a first gate electrode 68a was formed using lanthanum doped titanium nitride. In the PMOS transistor, a second gate oxide layer pattern 60b was formed using $HfO_2$, and a second gate electrode 70a was formed using aluminum doped titanium nitride.

A silicon nitride layer 82 included in the NMOS and PMOS transistors of Sample was deposited at a deposition temperature of about 480° C., a deposition pressure of about 5 torr via a high frequency voltage of about 100 W. A deposition gas included $SiH_4$, $NH_3$, $N_2$ and $H_2$. In this case, an inflowing amount of hydrogen gas for making bonds with dangling bonds was about 125% of a total amount of the reacting gases of $SiH_4$ and $NH_3$.

Manufacturing Comparative Sample

A common CMOS transistor was manufactured for comparing properties with the CMOS transistor in accordance with some embodiments disclosed herein. The Comparative Sample was manufactured by performing a similar process for forming the Sample for comparison except for the deposition process of the silicon nitride layer.

The silicon nitride layer included in the NMOS and PMOS transistors of Comparative Sample was deposited at a deposition temperature of about 480° C., a deposition pressure of about 5 torr and via a high frequency voltage of about 100 W. A deposition gas included $SiH_4$, $NH_3$, and $N_2$. In this case, inflowing amounts of $SiH_4$, $NH_3$, and $N_2$ were the same as those used for the manufacture of the Sample. In this case, hydrogen gas for making bonds with dangling bonds was not introduced.

Components included in the silicon nitride layer of the CMOS transistor of Sample in accordance with some embodiments discloses herein were compared with components included in the silicon nitride layer of the CMOS transistor of the Comparative Sample.

Figure 14:
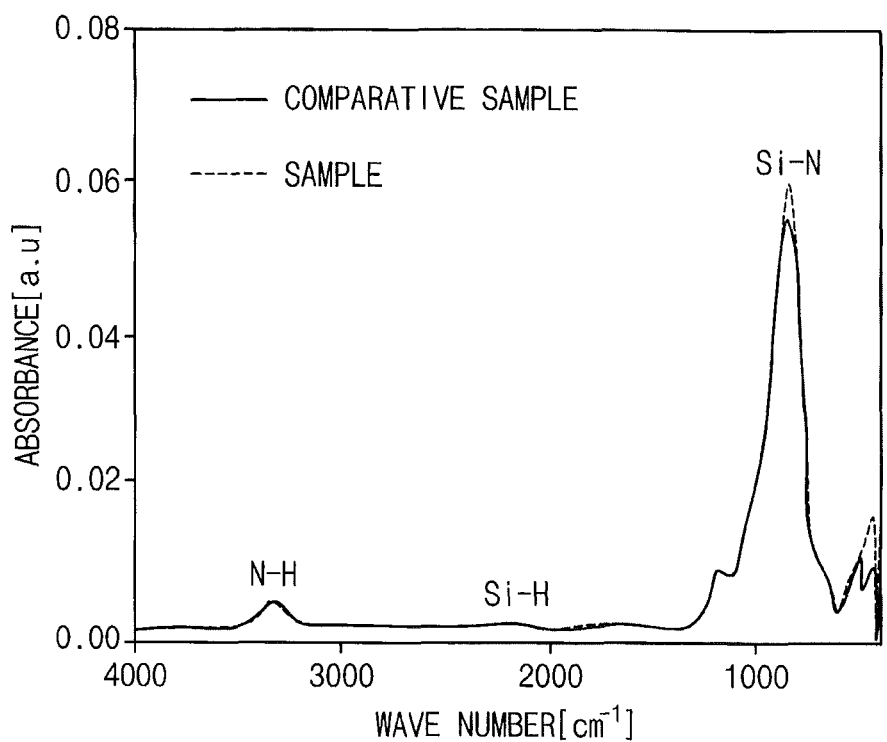

FIG. 14 is a FT-IR spectrum of a silicon nitride layer in Sample and Comparative Sample. As shown, each of the FT-IR spectrums of the silicon nitride layers of the Sample and the Comparative Sample shows similar pattern. In the silicon nitride layer of Sample CMOS transistor, more hydrogen may not be included relative to the Comparative Sample. That is, physical properties of the silicon nitride layer may not be substantially changed through the introduction of the hydrogen gas during depositing the silicon nitride layer.

A plasma damage monitoring voltage of each silicon germanium channel layer of Sample and Comparative Sample was compared.

Figure 15:
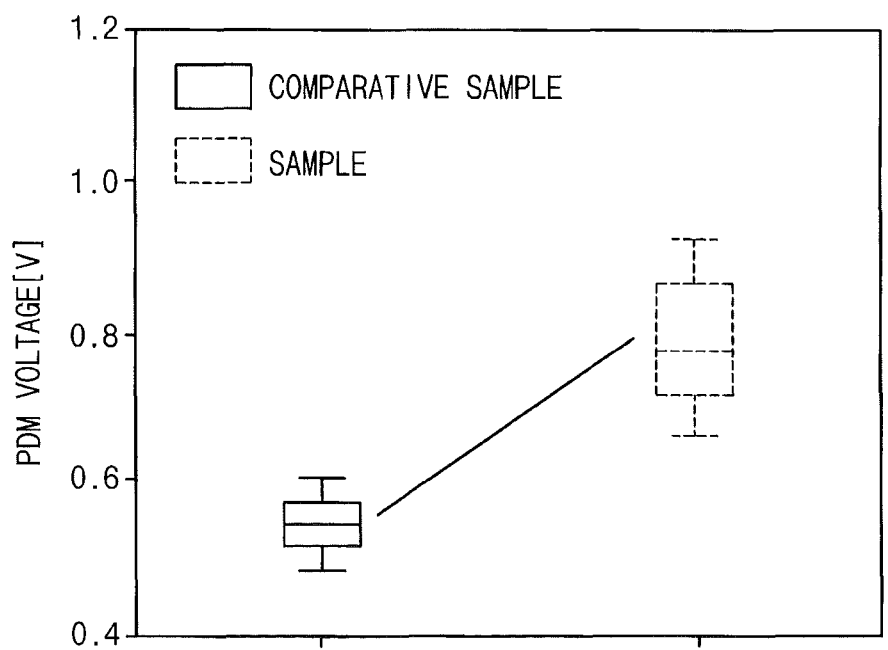

Reference is now made to FIG. 15, which illustrates a plasma damage monitoring voltage of a silicon germanium channel layer in Sample and Comparative Sample. As shown, the plasma damage monitoring voltage of the silicon germanium channel layer of Sample was higher than the plasma damage monitoring voltage of the silicon germanium channel layer of Comparative Sample. Because of hydrogen ions in the silicon germanium channel layer of Sample, the plasma damage monitoring voltage of Sample may be higher than that of Comparative Sample.

An interface trap density (Dit) for each silicon germanium channel layer of Sample and Comparative Sample was compared to each other.

Figure 16:
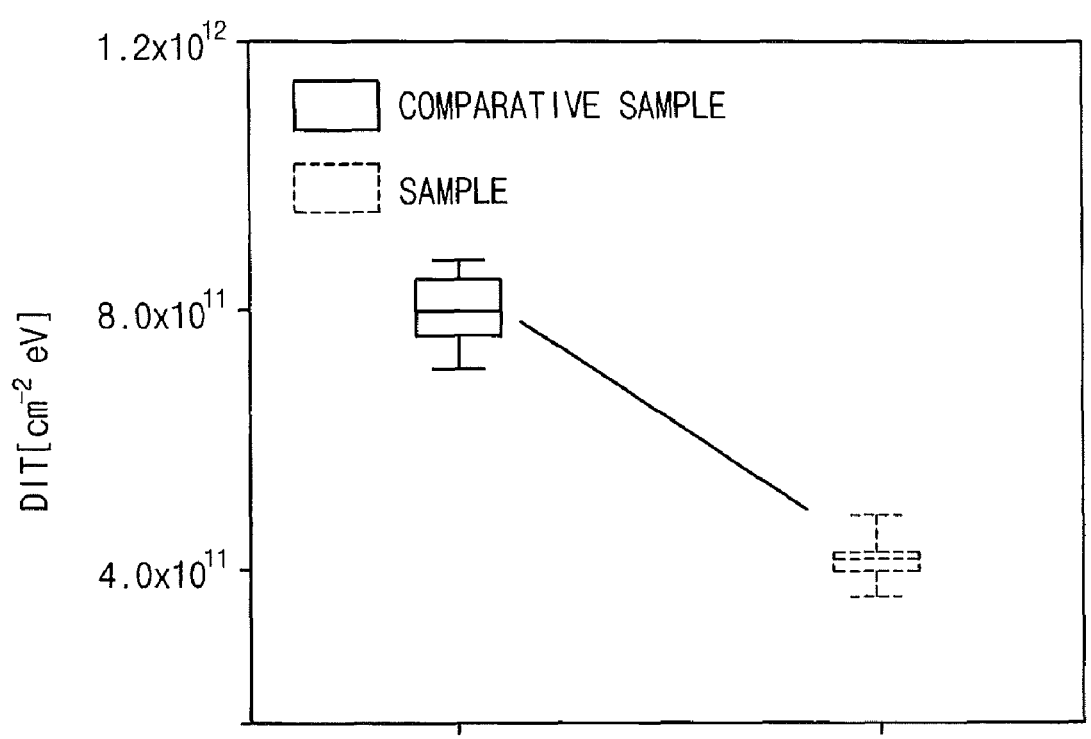

Reference is now made to FIG. 16, which illustrates an interface trap density of a silicon germanium channel layer in Sample and Comparative Sample. The interface trap density of the silicon germanium channel layer of Sample was even lower than that of the silicon germanium channel layer of Comparative Sample. That is, a number of traps at an interface of the silicon germanium channel layer and the second gate oxide layer pattern of Sample were smaller than that of Comparative Sample. Most of the dangling bonds at the interface of the silicon germanium channel layer may be removed by the introduced hydrogen gas during forming the silicon nitride layer of Sample.

Figure 17:
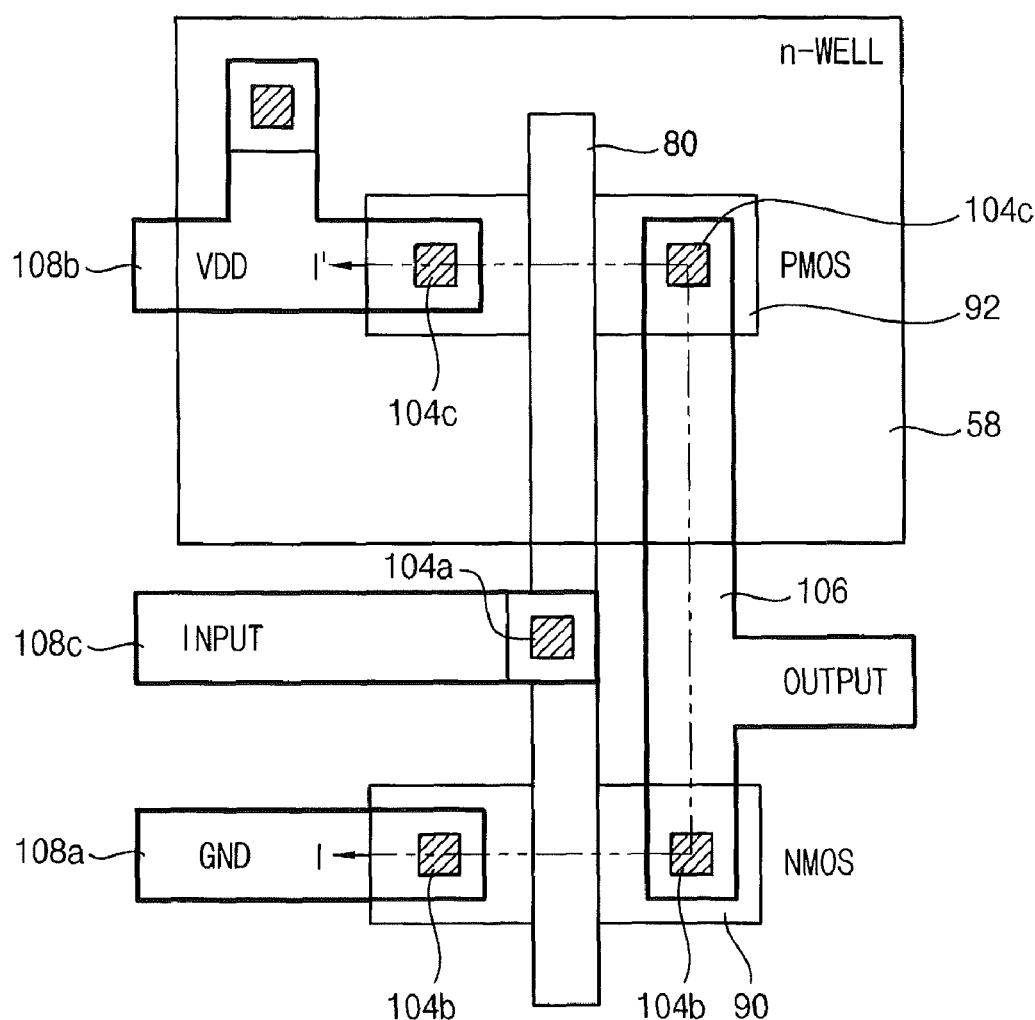
Figure 18:
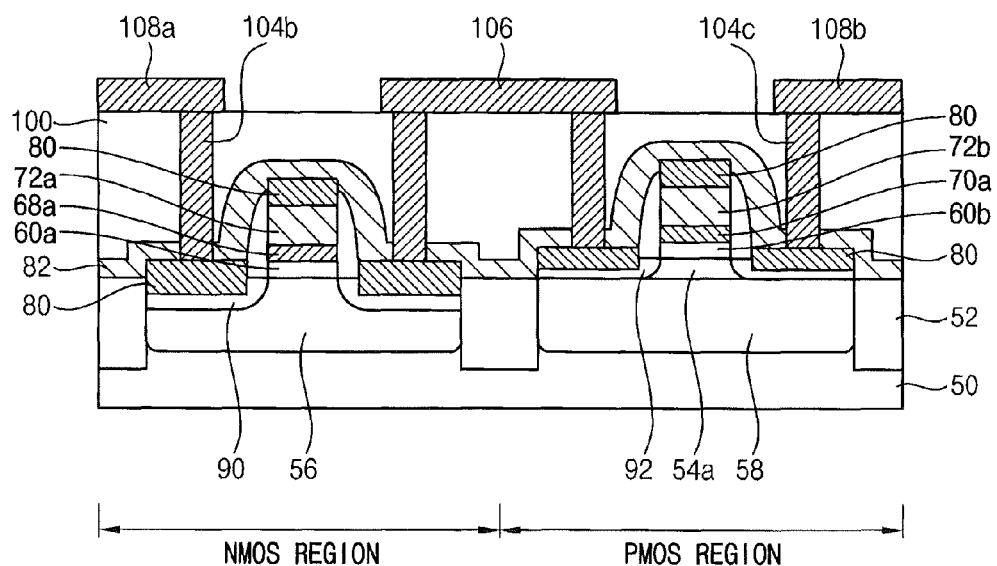

FIG. 17 is a plan view of a CMOS inverter in accordance with an example embodiment. FIG. 18 is a cross-sectional view cut along a line I-I' in FIG. 17.

A CMOS inverter explained hereinafter includes the CMOS transistor illustrated in FIG. 5.

Referring to FIGS. 17 and 18, an NMOS transistor and a PMOS transistor illustrated in FIG. 5 may be provided on substrate 50. First and second gate electrodes 68a and 70a may be electrically connected to each other.

An insulating interlayer 100 covering the NMOS transistor and the PMOS transistor may be provided.

A first contact plug 104a connected to the first and second gate electrodes 68a and 70a and second and third contact plugs 104b and 104c electrically connected to first and second impurity regions 90 and 92 through the insulating interlayer 100 may be provided.

A line 106 electrically connecting one of the first impurity regions 90 and one of the second impurity regions 92 to each other may be provided. The line 106 may have a shape configured to connect the second contact plug 104b and the third contact plug 104c to each other. The line 106 may be provided as an output line.

The second contact plug 104b connected to the remaining first impurity regions 90 may be connected to an earth line 108a. The third contact plug 104c connected to the remaining second impurity regions 92 may be connected to a power line 108b. The first contact plug 104a connected to the first and second gate electrodes 68a and 70a may be connected to an input line 108c.

The inverter structure including the CMOS transistor illustrated in FIG. 5 has been explained in this example embodiment. Some embodiments provide that various circuits including the NMOS transistor and the PMOS transistor illustrated in FIG. 5 may be manufactured. For example, a CMOS NAND gate circuit, a CMOS NOR gate circuit, etc. including the NMOS transistor and the PMOS transistor illustrated in FIG. 5 may be manufactured.

Figure 19:
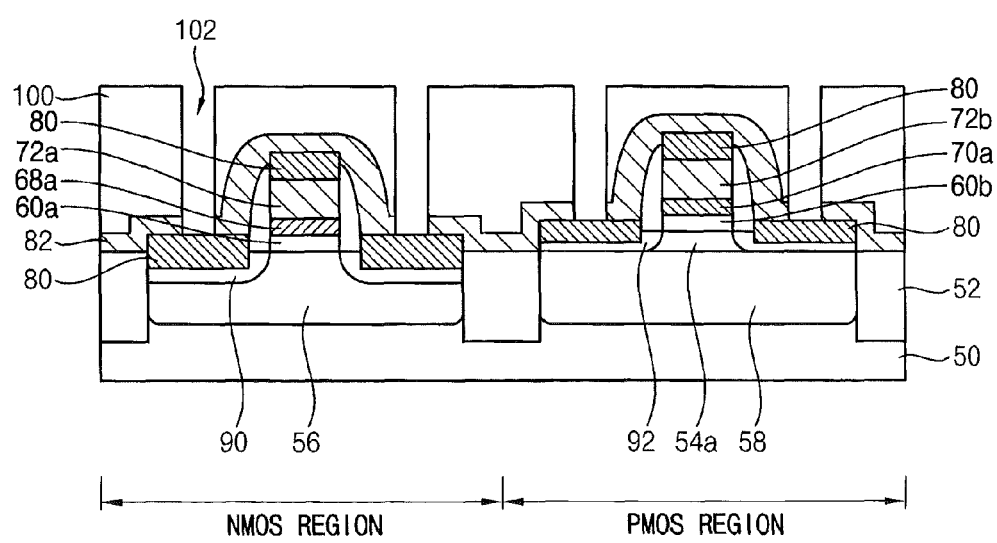

FIG. 19 is a cross-sectional view for explaining methods of manufacturing a CMOS inverter in FIGS. 17 and 18. The NMOS transistor and the PMOS transistor illustrated in FIG. 5 may be formed by performing similar processes explained referring to FIGS. 6 to 11. In this case, the first and second gate electrodes 68a and 70a of the NMOS transistor and the PMOS transistor may be formed so as to electrically connect each other.

An insulating interlayer 100 covering the NMOS transistor and the PMOS transistor may be formed. The insulating interlayer 100 may be formed by depositing silicon oxide.

A portion of the insulating interlayer 100 may be etched to form openings exposing a silicon nitride layer 82 provided as an etch stopping layer. Then, the exposed silicon nitride layer 82 may be removed to form contact holes 102 exposing a metal silicide pattern 80 contacting the first and second impurity regions 90 and 92. In this case, contact holes exposing the metal silicide pattern 80 and disposed on the first and second gate electrodes 68a and 70a may be formed.

A conductive layer (not shown) filling inner portions of the contact holes 102 may be formed on the insulating interlayer 100 as illustrated in FIGS. 17 and 18. Wiring lines 106, 108a and 108b may be formed by patterning the conductive layer.

As described above, MOS transistor in accordance with some embodiments may be used in a logic system having a high performance and a peripheral circuit of a memory device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a transistor, the method comprising:
    forming a silicon germanium channel layer on a portion of a single crystalline silicon substrate;
    forming a first gate structure and a second gate structure, each of the first and second gate structures including a gate oxide layer pattern, a conductive layer pattern and a polysilicon layer pattern on the single crystalline silicon substrate and the silicon germanium channel layer;
    forming a first impurity region by doping n-type impurities into the single crystalline silicon substrate at both sides of the first gate structure;
    forming a second impurity region by doping p-type impurities into the silicon germanium channel layer at both sides of the second gate structure; and
    forming a silicon nitride layer on a surface of the single crystalline silicon substrate, the silicon germanium channel layer and the first and second gate structures, the silicon nitride layer operable to remove dangling bonds at an inner portion and/or a surface portion of the silicon germanium channel layer via a depositing gas that includes a reacting gas, an atmosphere gas and a hydrogen gas, and wherein the silicon nitride layer is operable to apply a tensile stress.

2. The method of claim 1, wherein the reacting gas includes $SiH_4$ and $NH_3$, and the atmospheric gas includes at least one gas selected from the group consisting of nitrogen, argon and helium.

3. The method of claim 1, wherein the hydrogen gas is introduced by about 5% to about 700% of a total inflowing amount of the reacting gas.

4. The method of claim 1, wherein the single crystalline silicon substrate and the silicon germanium channel layer have the same channel direction.

5. The method of claim 1, wherein about 10% to about 60% of germanium is included in the silicon germanium channel layer during forming the silicon germanium channel layer.

6. The method of claim 3, wherein each of the conductive layer patterns included in the first and second gate structures includes the same metal material, wherein each of the conductive layer patterns includes a different work function.

7. The method of claim 1, further comprising:
    forming a spacer on a side wall of each of the first and second gate structures; and
    forming a metal silicide pattern contacting the first and second impurity regions and an upper surface of the polysilicon layer pattern.

8. The method of claim 1, wherein the gate oxide layer pattern includes at least one selected from the group consisting of $HfO_2$, $Al_2O_3$, $ZrO_2$, $Y_2O_3$, $La_2O_3$, $Ta_2O_3$ and $TiO_2$, and the conductive layer pattern includes titanium.

9. The method of claim 6, wherein forming the first gate structure and the second gate structure comprises:
    forming a gate oxide layer including metal oxide having a high dielectric property and a conductive layer including a metal on the single crystalline silicon substrate and the silicon germanium channel layer;
    forming a first thin film on a portion of an upper surface of the conductive layer for controlling a threshold voltage and a second thin film on a remaining region of the upper surface of the conductive layer for controlling the threshold voltage;
    forming a polysilicon layer and a hard mask pattern on the first and second thin films; and
    patterning the polysilicon layer, the conductive layer and the gate oxide layer to form the first and second gate structures.

10. A method of manufacturing a transistor, the method comprising:
    forming a silicon germanium channel layer in a portion of a single crystalline silicon substrate;
    forming a PMOS transistor on the silicon germanium channel layer; and
    forming a silicon nitride layer that is operable to remove dangling bonds from an inner portion and/or a surface portion of the silicon germanium channel layer and to apply a tensile stress, the silicon nitride layer being formed using a deposition gas including a reacting gas, an atmospheric gas and a hydrogen gas on surface of the single crystalline silicon substrate, the silicon germanium channel layer and the PMOS transistor.

11. The method of claim 10, wherein the hydrogen gas is introduced by about 5% to about 700% of a total inflowing amount of the reacting gas.

12. The method of claim 10, wherein the reacting gas includes $SiH_4$ and $NH_3$, and the atmospheric gas includes at least one gas selected from the group consisting of nitrogen, argon and helium.

13. The method of claim 10, wherein forming the silicon germanium channel layer comprises:
   forming a mask pattern selectively exposing the PMOS region in the single crystalline silicon substrate; and
   performing a selective and epitaxial growing process to form the silicon germanium channel layer on the exposed single crystalline silicon substrate.

14. The method of claim 10, wherein the single crystalline silicon substrate and the silicon germanium channel layer have the same channel direction.

15. The method of claim 10, wherein forming the PMOS transistor comprises:
   forming a gate oxide layer including metal oxide having a high dielectric property, a conductive layer including a metal, a polysilicon layer and a hard mask pattern on the silicon germanium channel layer;
   etching the polysilicon layer, the conductive layer and the gate oxide layer to form a gate structure including a gate oxide layer pattern, a conductive layer pattern and a polysilicon layer pattern; and
   doping p-type impurities into the silicon germanium channel layer at both sides of the gate structure to form an impurity doped region.

16. The method of claim 10, further comprising forming an NMOS transistor using the single crystalline silicon substrate as a channel on the single crystalline silicon substrate.

17. The method of claim 10, wherein about 10% to about 60% of germanium is included in the silicon germanium channel layer during forming the silicon germanium channel layer.

18. The method of claim 15, further comprising forming a metal silicide pattern contacting the impurity doped region and an upper surface of the polysilicon layer pattern.

19. A method of manufacturing a transistor, the method comprising:
   forming a silicon germanium channel layer on a portion of a single crystalline silicon substrate;
   forming a first gate structure and a second gate structure, each of the first and second gate structures including a gate oxide layer pattern, a conductive layer pattern and a polysilicon layer pattern on the single crystalline silicon substrate and the silicon germanium channel layer;
   forming a first impurity region by doping n-type impurities into the single crystalline silicon substrate at both sides of the first gate structure;
   forming a second impurity region by doping p-type impurities into the silicon germanium channel layer at both sides of the second gate structure; and
   removing dangling bonds at an inner portion and/or a surface portion of the silicon germanium channel layer by forming a silicon nitride layer on a surface of the single crystalline substrate, the silicon germanium channel layer and the first and second gate structures via a depositing gas that includes a reacting gas, an atmosphere gas and a hydrogen gas,
   wherein the silicon nitride layer is operable to apply a tensile stress.

20. The method of claim 19, wherein the hydrogen gas is introduced by about 5% to about 700% of a total inflowing amount of the reacting gas.

* * * * *